United States Patent
Shim et al.

(10) Patent No.: US 6,841,858 B2
(45) Date of Patent: Jan. 11, 2005

(54) LEADFRAME FOR DIE STACKING APPLICATIONS AND RELATED DIE STACKING CONCEPTS

(75) Inventors: Il Kwon Shim, Singapore (SG); Kambhampati Ramakrishna, Chandler, AZ (US); Seng Guan Chow, Singapore (SG)

(73) Assignee: ST Assembly Test Services PTE Ltd., Singapore (SG)

( * ) Notice: Subject to any disclaimer, the term of this patent is extended or adjusted under 35 U.S.C. 154(b) by 70 days.

(21) Appl. No.: 10/256,407

(22) Filed: Sep. 27, 2002

(65) Prior Publication Data

US 2004/0061202 A1 Apr. 1, 2004

(51) Int. Cl.⁷ ............................................. H01L 23/495
(52) U.S. Cl. ...................... 257/676; 257/686; 257/723; 257/784
(58) Field of Search ................................. 257/676, 686, 257/723, 784

(56) References Cited

U.S. PATENT DOCUMENTS

| | | | |
|---|---|---|---|
| 5,814,881 A | 9/1998 | Alagaratnam et al. | 257/686 |
| RE36,613 E | 3/2000 | Ball | 257/777 |
| 6,080,264 A | 6/2000 | Ball | 156/292 |
| 6,087,718 A | 7/2000 | Cho | 257/686 |
| 6,087,722 A | 7/2000 | Lee et al. | 257/723 |
| 6,118,176 A | 9/2000 | Tao et al. | 257/676 |
| 6,261,865 B1 | 7/2001 | Akram | 438/111 |
| 6,297,547 B1 * | 10/2001 | Akram | 257/676 |
| 6,303,981 B1 | 10/2001 | Moden | 257/666 |
| 6,307,257 B1 | 10/2001 | Huang et al. | 257/676 |
| 6,337,521 B1 | 1/2002 | Masuda | 257/777 |
| 6,483,181 B2 * | 11/2002 | Chang et al. | 257/686 |

* cited by examiner

Primary Examiner—Luan Thai

(57) ABSTRACT

A leadframe design (and method of forming the leadframe design), comprising: an inner die pad structure lying in a first plane; and an outer die pad structure supported by outer tie bars and connected to the inner die pad by inner tie bars. The outer die pad structure lying in a second plane spaced apart from the inner die pad structure first plane. An outer package surrounds at least the inner die pad structure and the inner tie bars. The outer die pad structure being supported by the outer tie bars. The outer package having outer walls. Lead fingers extend through the outer package outer walls and include respective inner portions extending into the outer package proximate the inner and outer die pad structures. The inner portions of the lead fingers lie in a third plane, wherein at least one of the inner die pad structure first plane and the outer die pad structure second plane lie outside of the lead finger inner portions third plane and wherein a first chip is affixed to the inner die pad structure and a second chip is affixed to the outer die pad structure.

84 Claims, 11 Drawing Sheets

LEADFRAME FOR DIE STACKING APPLICATIONS AND RELATED DIE STACKING CONCEPTS

BACKGROUND OF THE INVENTION

Current practice involves electrical isolation of the two stacked dies from each other and the leadframe using an electrically insulating die attach material. However, several problems exist when using current practice methods/ electrical isolation techniques such as: potential for resin bleeding (contamination of the bond pad near the bottom encapsulant material layer) and contamination of wire bond pads; potential for damage of the lead wires of the lower die during wirebonding of the upper die and during subsequent handling; potential for a lower moisture sensitive level (MSL) because of the larger die attachment interface areas for both the lower and upper dies; a third element is required to create a Z-axis spacing between the two stacked dies by using either a film or a silicon/ceramic spacer; and a leadframe having a large die pad down-set value is needed which may not be manufacturable in high volume.

The moisture sensitive level (MSL) is an important factor to be considered during package design. The MSL determines how long an assembler can keep the parts "on the shelf" before they must be surface mounted on boards. MSL level 1 components are the most desirable and essentially would have an indefinite shelf life. MSL level 2 components have about a one year shelf life and MSL level 3 components only have a one week self life before moisture contamination would render the components unreliable/unusable. Moisture can cause delamination or voids, usually at the chip/die pad interface.

U.S. Pat. No. 6,261,865 B1 to Akram describes a multichip semiconductor package using a lead-on-chip lead frame and method of construction.

U.S. Pat. No. 6,087,722 to Lee et al. describes a multichip package that does not include a die pad.

U.S. Pat. No. 6,118,176 to Tao et al. describes a stacked chip assembly generally includes a first chip, a second chip and a lead frame.

U.S. Pat. No. 6,297,547 B1 to Akram describes a multiple die package in which a first and second die are mounted on a leadframe.

U.S. Pat. No. 5,814,881 to Alagaratnam et al. describes a stacked integrated chip package and method of making same.

U.S. Pat. No. Re. 36,613 to Ball describes a multiple stacked die device that contains up to four dies and permits close-tolerance stacking by a low-loop-profile wire-bonding operation and a thin-adhesive layer between the stacked dies.

U.S. Pat. No. 6,080,264 to Ball describes an apparatus and method for increasing integrated circuit density comprising utilizing chips with both direct (flip chip type) chip to conductors connection technology and wire bonds and/or tape automated bonding (TAB).

U.S. Pat. No. 6,087,718 to Cho describes a stacked-type semiconductor chip package of a lead-on chip structure which is modified for stacking chips in the package.

U.S. Pat. No. 6,307,257 B1 to Huang et al. describes a dual-chip integrated circuit (IC) package with a chip-die pad formed form leadframe leads.

U.S. Pat. No. 6,337,521 B1 to Masuda describes a semiconductor device and a method of manufacturing the same.

The device comprising two semiconductor chips stacked on each other with their backs opposite to each other and sealed with a mold resin.

SUMMARY OF THE INVENTION

Accordingly, it is an object of one or more embodiments of the present invention to provide electrically isolated stacked die leadframe design packages and methods of forming same.

Additional objects of one or more embodiments of the present invention is to provide electrically isolated stacked die leadframe design packages: (a) having higher reliability; (b) providing more ways of die stacking such as one down-set, two down-sets and up-set combination; and (c) manufacturability in high volume and methods of forming same.

Other Objects Will Appear Hereinafter.

It has now been discovered that the above and other objects of the present invention may be accomplished in the following manner. Specifically, a leadframe design (and method of forming the leadframe design) is provided comprising: an inner die pad structure lying in a first plane; and an outer die pad structure supported by outer tie bar and connected to the inner die pad by inner tie bars. The outer die pad structure lying in a second plane spaced apart from the inner die pad structure first plane. An outer package surrounds at least the inner die pad structure and the inner tie bars. The outer die pad structure being supported by the outer tie bars. The outer package having outer walls. Lead fingers extend through the outer package outer walls and include respective inner portions extending into the outer package proximate the inner and outer die pad structures. The inner portions of the lead fingers lie in a third plane, wherein at least one of the inner die pad structure first plane and the outer die pad structure second plane lie outside of the lead finger inner portions third plane and wherein a first chip is affixed to the inner die pad structure and a second chip is affixed to the outer die pad structure.

BRIEF DESCRIPTION OF THE DRAWINGS

The features and advantages of the method of the present invention will be more clearly understood from the following description taken in conjunction with the accompanying drawings in which like reference numerals designate similar or corresponding elements, regions and portions and in which:

FIG. 2 being a plan view of a FIG. 1 quad package without the stacked dies/chips; FIG. 3 being a plan view of a FIG. 1 dual in-line package without the stacked dies/chips and FIG. 4 being a plan, partial cut-away view of a FIG. 1 quad package showing the stacked dies/chips.

FIG. 13 being a plan view of the seventh embodiment without a ring and without illustrating stacked dies/chips; FIG. 12 is a cross-sectional view of FIG. 13 along line 12—12 (plus the stacked dies/chips).

DETAILED DESCRIPTION OF THE PREFERRED EMBODIMENT

Characteristics Common to the First Through Sixth Embodiments (FIGS. 1 to 11)

The inventors have discovered the following semiconductor package for packaging stacked dies/chips. Specifically, the package has two die pads with differing elevations that consist of a window shape with an outer ring and a center die pad supported by tie bars.

Figure 5:
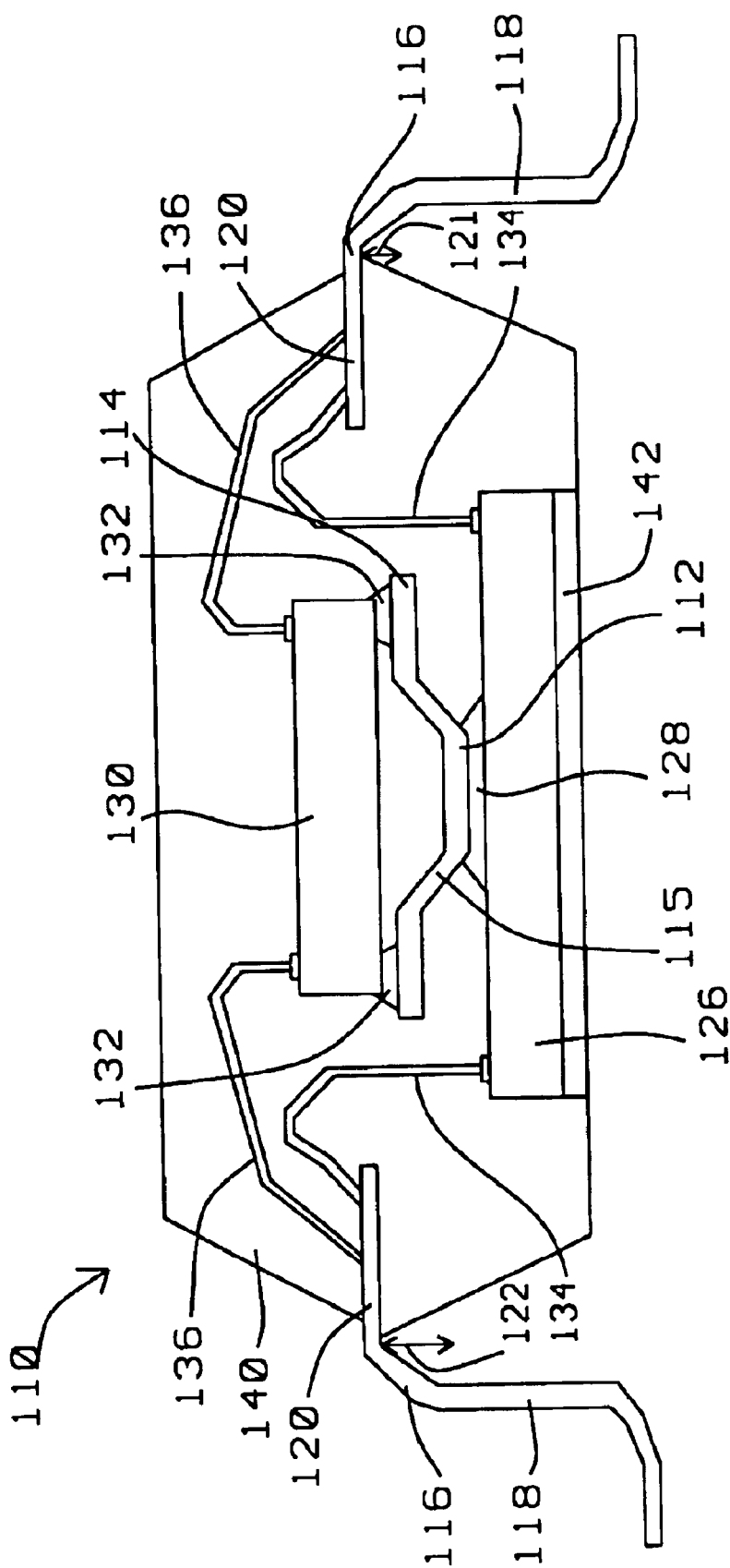
FIGS. 5 to 7 schematically illustrate the double down-set second embodiment of the present invention with FIG. 6 being a plan view of a FIG. 5 quad package without the stacked dies/chips and FIG. 7 being a plan view of a FIG. 5 dual in-line package without the stacked dies/chips.
Figure 6:
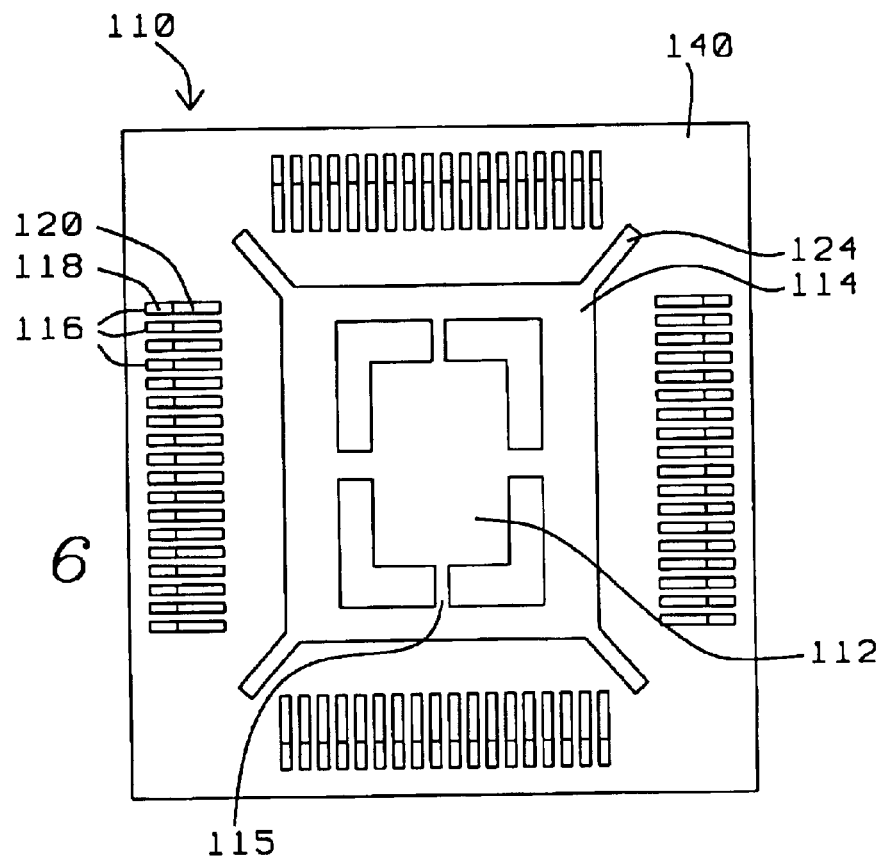
Figure 7:
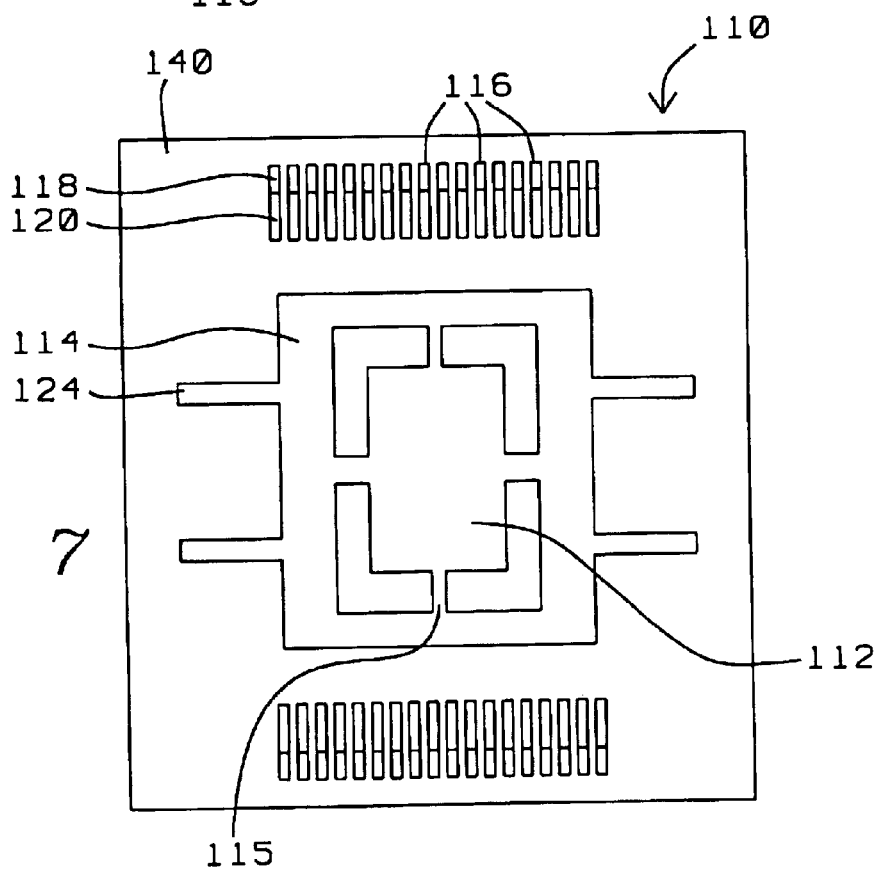
Figure 8:
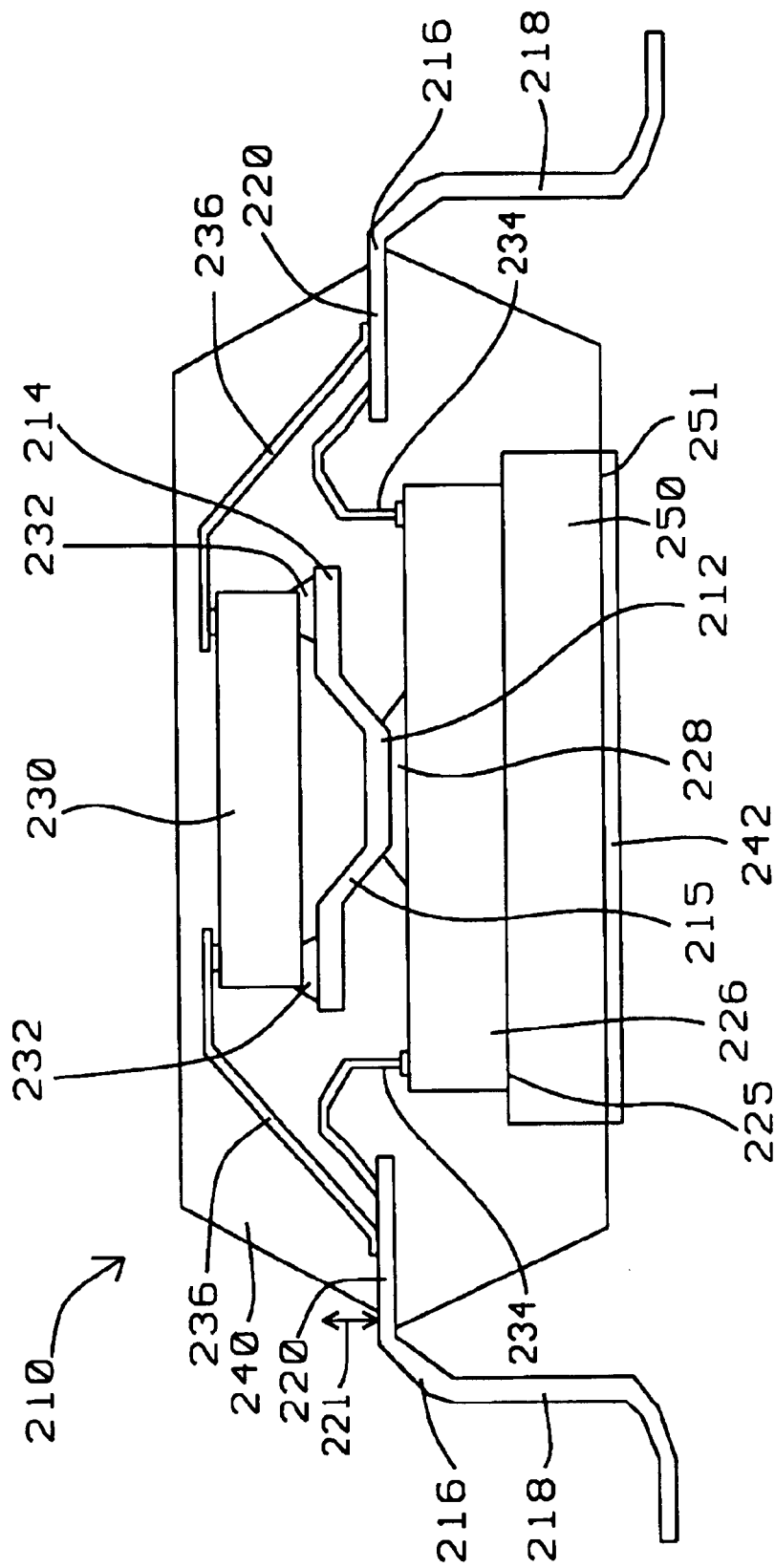
FIG. 8 schematically illustrates a cross-sectional view of the single upset heat sink third embodiment of the present invention.
Figure 10:
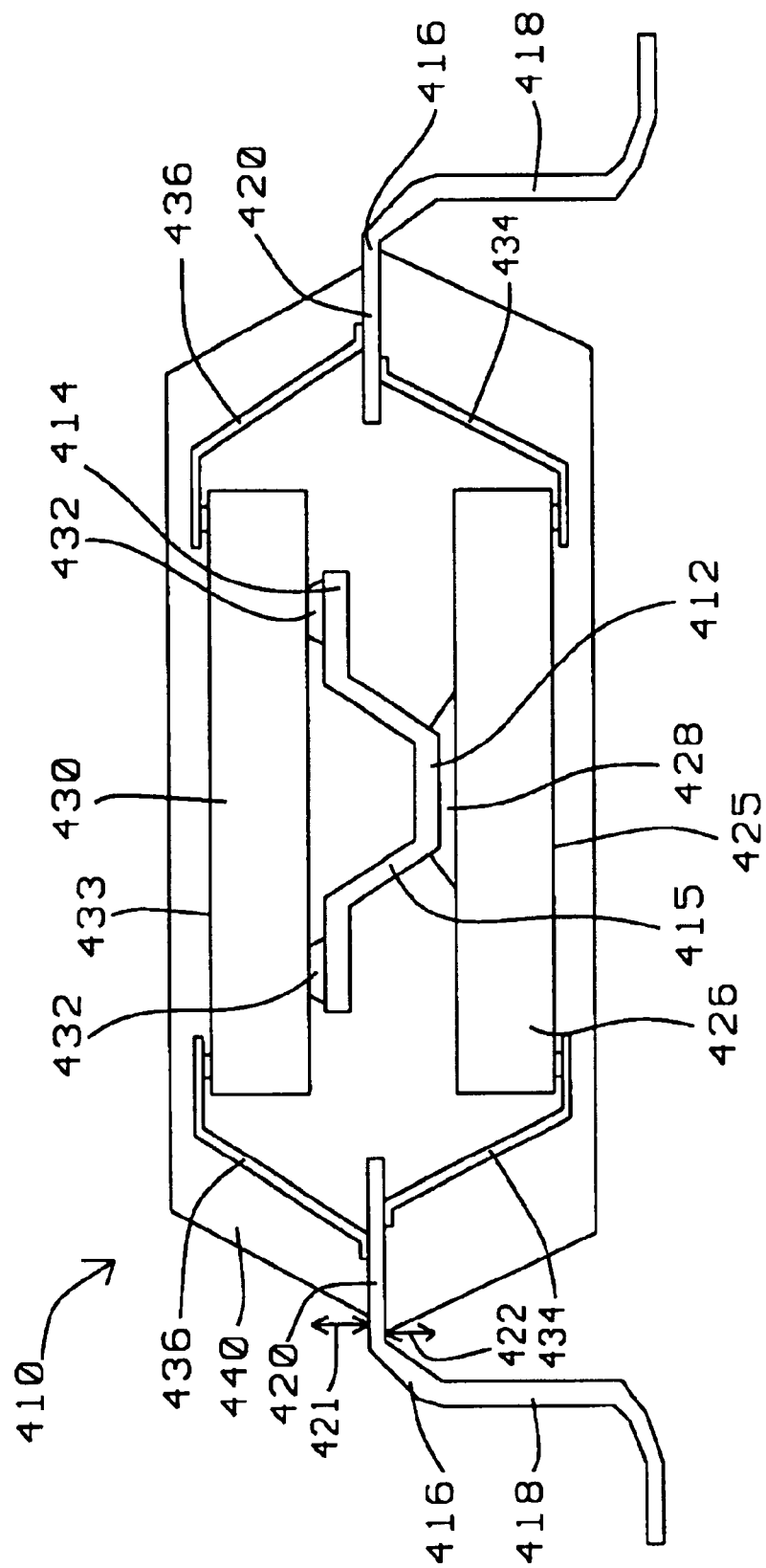
FIG. 10 schematically illustrates a cross-sectional view of the same size die/chip up & down-set fifth embodiment of the present invention using a mirror image die.
Figure 11:
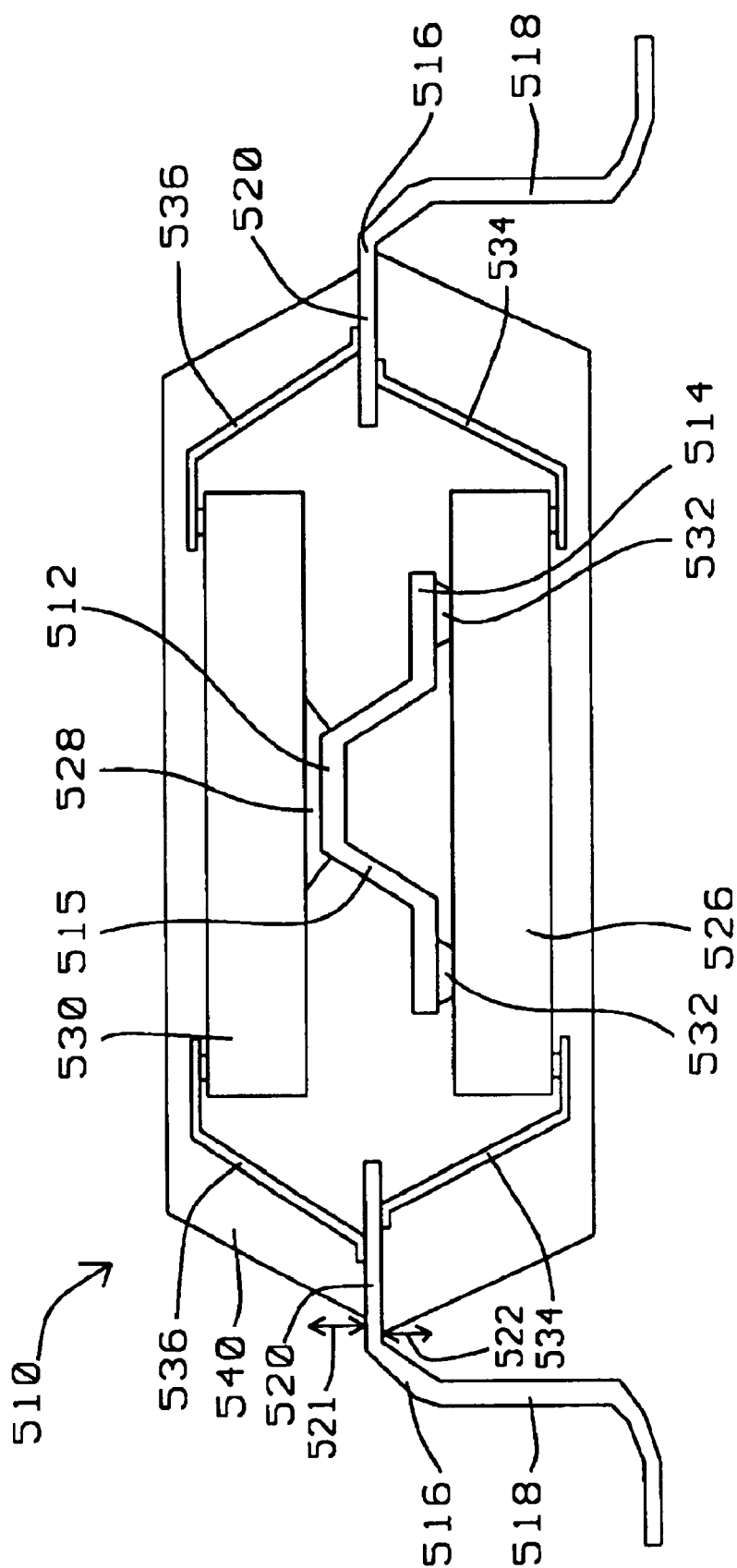
FIG. 11 schematically illustrates a cross-sectional view of the same size die/chip up & down-set sixth embodiment using a flipped die pad.

Using these features, it is possible to have various combinations of the die pads in relation to the lead fingers, including:

a) only the inner die pad is down set (the first embodiment illustrated in FIGS. 1 to 4);

b) die pad with double set down, i.e. the inner die pad and the outer ring die pad are down set (the second embodiment illustrated in FIGS. 5 to 7);

c) only the outer ring die pad is up set (negative down set) (the third embodiment illustrated in FIG. 8);

d) up set (negative down set) of the outer ring die pad and down set of the inner die pad (the fourth embodiment illustrated in FIG. 9, and the fifth embodiment illustrated in FIG. 10); and e) up set (negative down set) of the inner die pad and down set of the outer ring die pad (the sixth embodiment illustrated in FIG. 11).

The generally benefits and advantages of the present invention include: the die attachment interface area is reduced; the packages are made more robust, i.e. there is less stress created at the die pads; there is lower stress in the die attachment interfaces; the packages are less sensitive to moisture adsorption, i.e. the MSL level is improved; and the double down-set leadframe embodiments are well suited for die stacking. Please see the individual descriptions of the individual embodiments for additional benefits and advantages.

Figure 12:
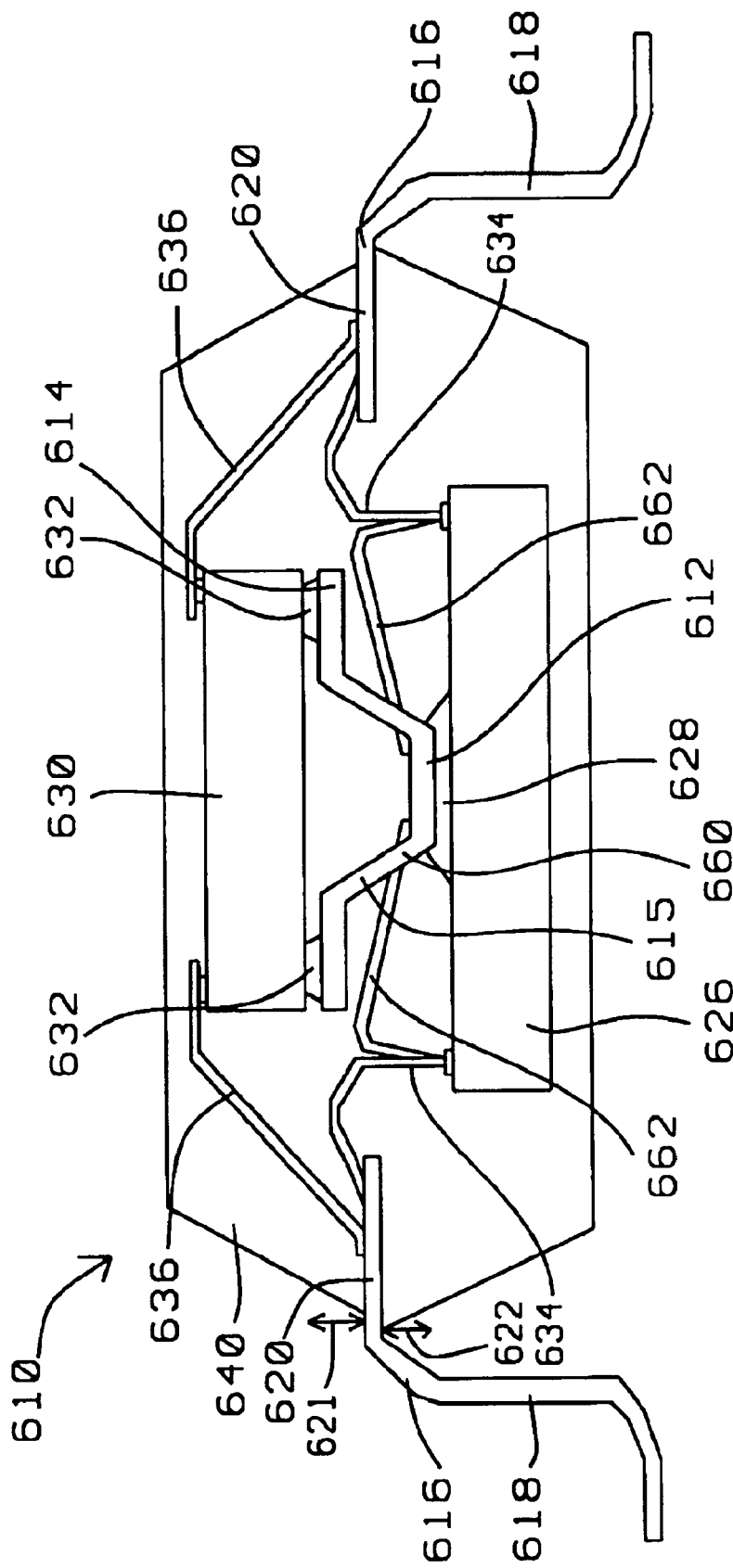
FIGS. 12 and 13 schematically illustrates the up & down-set seventh embodiment using a two pass process for the die attachment and wire bonding with an inner die pad lead finger attachment (grounding)
Figure 13:
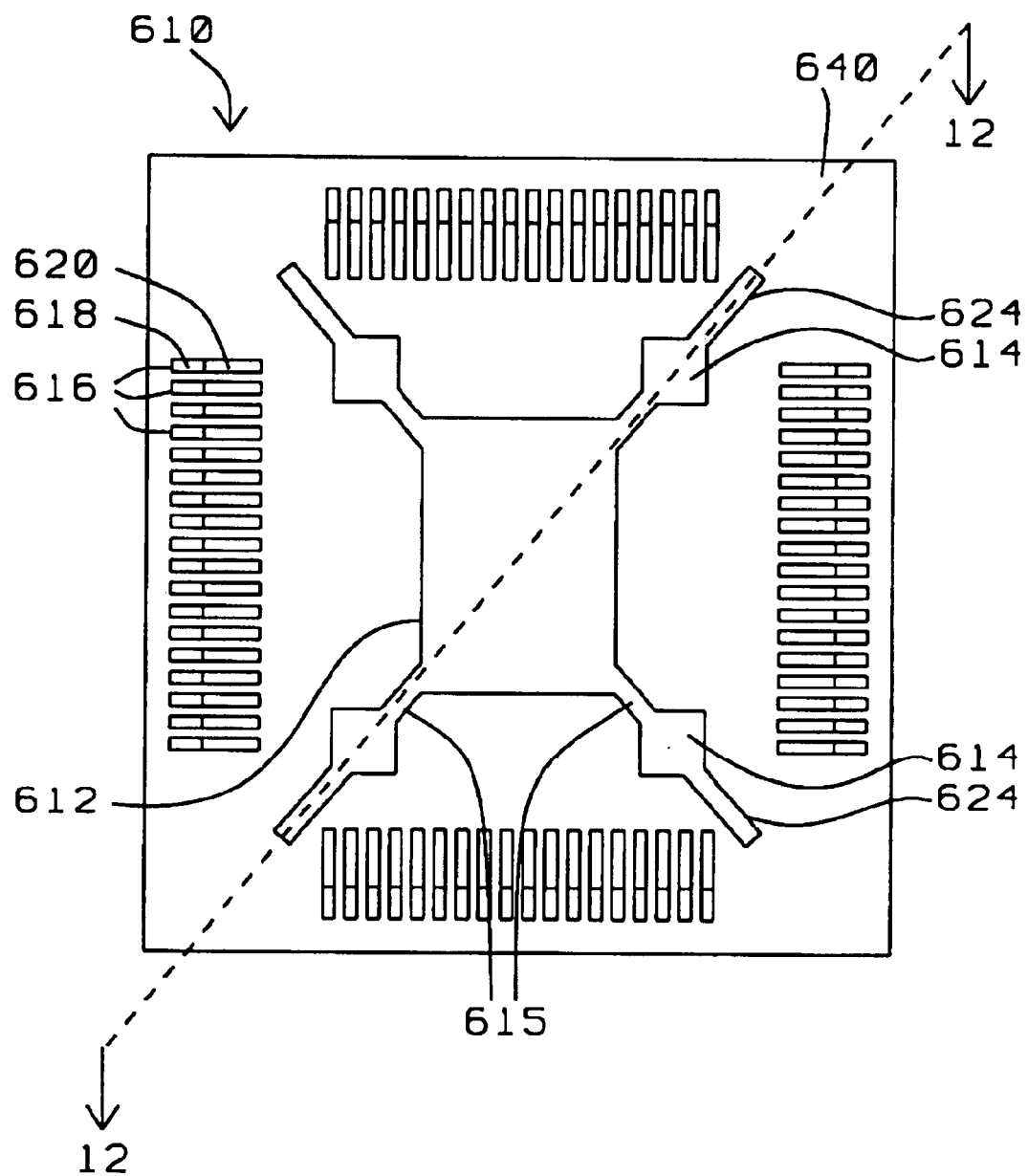

Alternatively, in the seventh embodiment, and as shown in FIGS. 12 and 13, the inventors have discovered a semiconductor package for packaging stacked dies/chips that consists of discrete outer die pads affixed to the tie bars and a center pad supported by tie bars. In this alternative, the outer ring shaped die pad is not needed.

It is noted that the inner die pad can be of any shape as long as it is within the area of die encircled by the bond pads.

First Embodiment—Single Down-Set of the Inner/Center Die Pad 12; FIGS. 1 to 4

As shown in FIGS. 1 to 4, the first embodiment of the present invention illustrates a package 10 having a leadframe design where there is a single down-set of only the inner/center die pad 12 in relation to the inner portions 20 of lead fingers 16.

Lead fingers 16 include an outer portion 18 exterior of package 10, and an inner portion 20 within package 10.

Inner/center die pad 12 is spaced downwardly (down-set) from inner portions 20 of lead fingers 16 as at 22 from preferably about 100 to 1000 $\mu$m and more preferably from about 200 to 500 $\mu$m.

Figure 1:
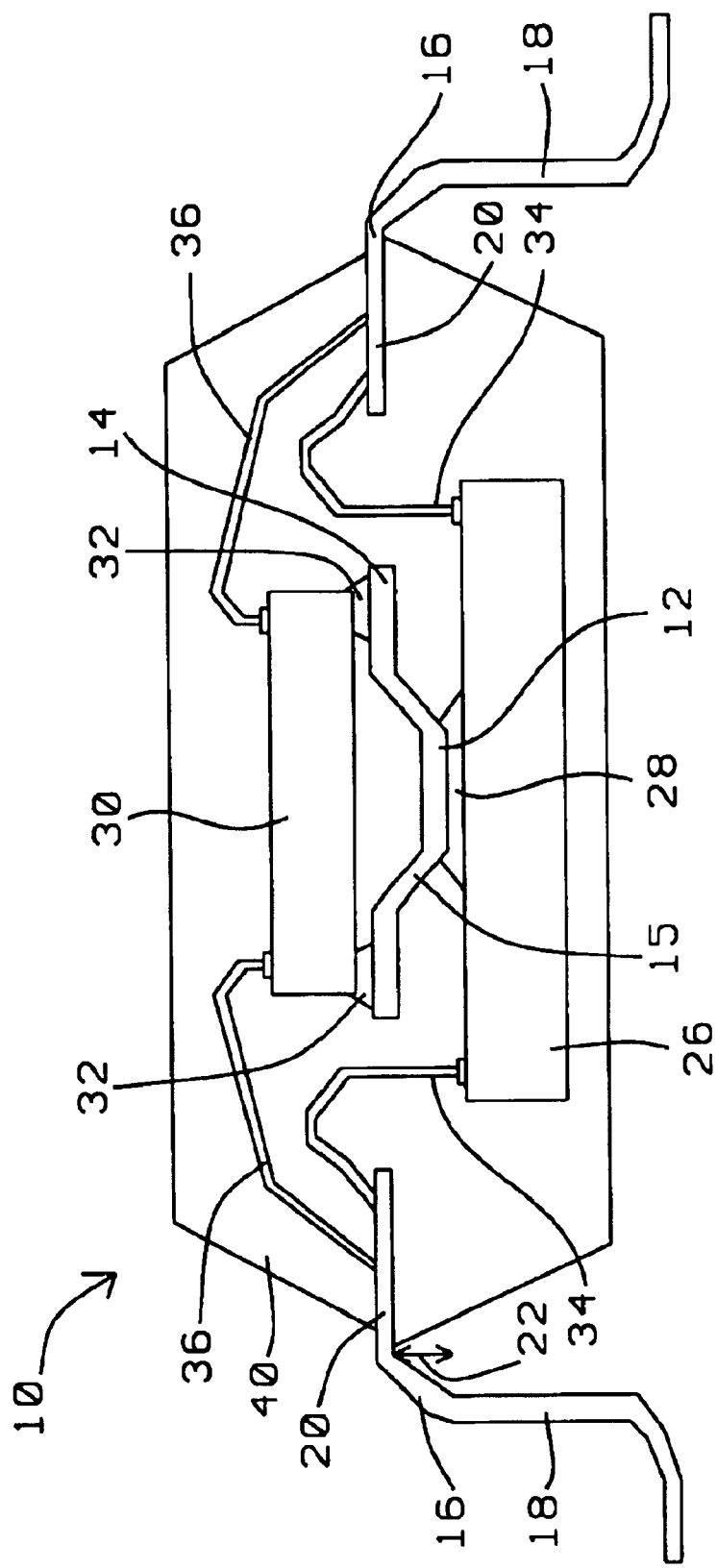
FIGS. 1 to 4 schematically illustrate the single down-set first embodiment of the present invention with FIG. 1 being the cross-sectional view of FIG. 4 at line 1—1.

Outer ring die pad 14 is substantially in the same plane as the inner portions 20 of lead fingers 16 as shown in FIG. 1.

Figure 2:
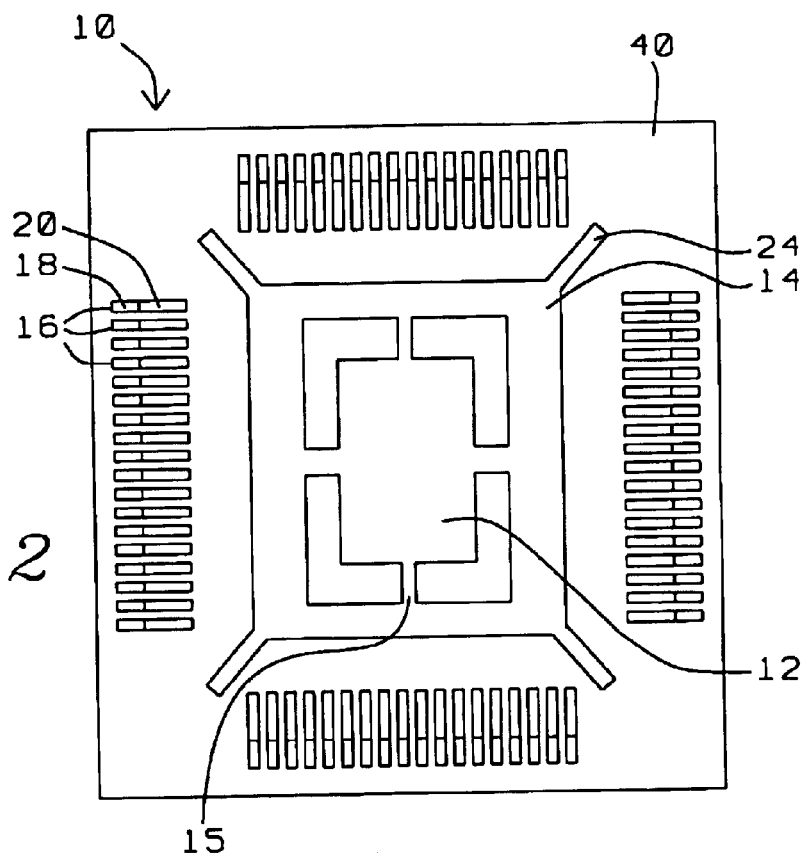
Figure 3:
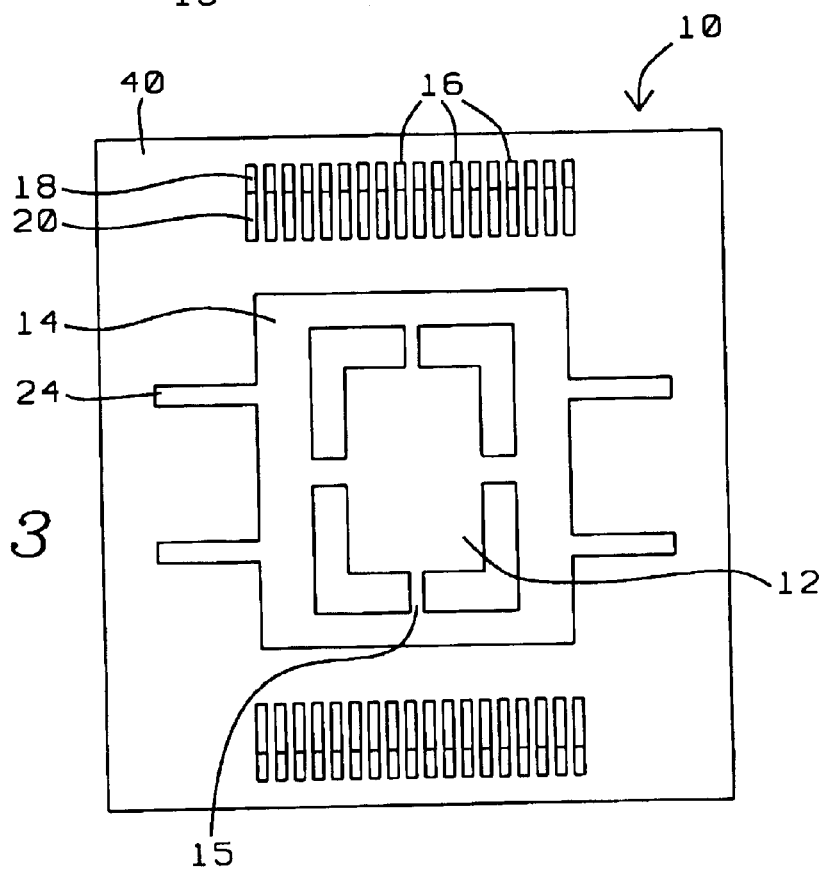

As more clearly illustrated in FIGS. 2 and 3, inner/center die pad 12 is generally a solid structure connected to ring-shaped outer ring die pad 14 by inner tie bars 15. Outer ring die pad 14 is positioned within package 10 using outer tie bars 24. FIG. 2 illustrates a quad package 10 using the structure of FIG. 1 (without showing the dies/chips 26, 30) while FIG. 3. illustrates a dual in-line package 10 using the structure of FIG. 1 (without showing the dies/chips 26, 30).

Lower die/chip 26 is affixed to inner/center die pad 12 using die attachment (D/A) resin 28 and upper die/chip 30 is affixed to outer ring die pad 14 using D/A resin 32. Then, lower lead wires 34 are connected to the upper surface of inner portion 20 of lead fingers 16 and to the upper surface of lower die/chip 26 by wire bonding. Then, upper lead wires 36 are connected to the upper surface of finger leads 16 and to the upper surface of upper die/chip 30 by wire bonding.

An encapsulant material 40 is then formed around the lower and upper die/chips 26, 30, lead wires 34, 36, inner/center die pad 12, outer ring die pad 14, etc. to complete package 10.

Figure 4:
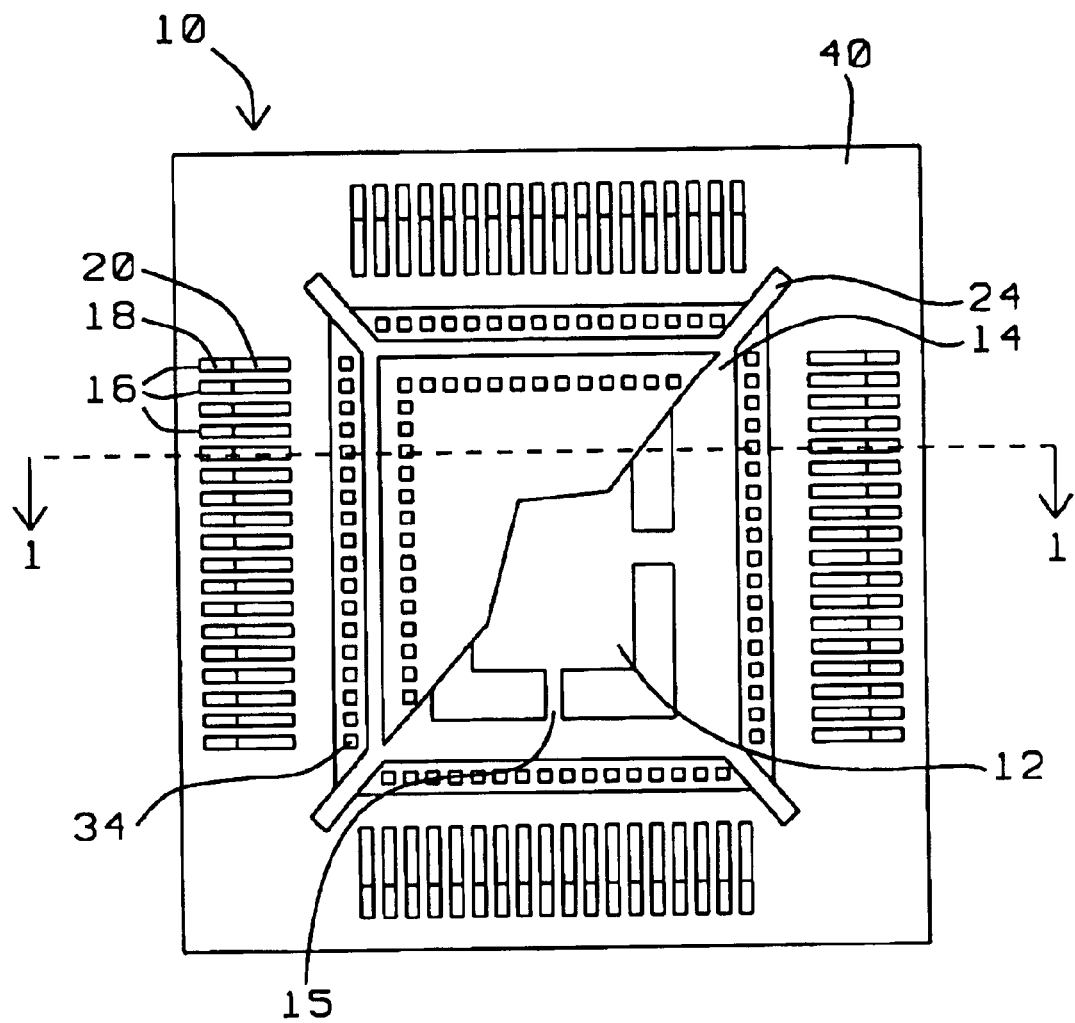

As shown in FIGS. 1 and 4, lower die/chip 26 is larger, i.e. wider and longer, than upper die/chip 30 to facilitate the wire bonding pattern.

It is noted that the die attachment interfaces for the inner/center die pad 12 to the lower die/chip 26 using resin 28 and for the outer ring die pad 14 to the upper die/chip 30 using resin 32 are greatly reduced compared to conventional attachment interfaces.

The benefits and advantages of the first embodiment include: no die attach resin bleeding issues for the bottom die; smaller die attachment interfaces for both dies which reduces the sensitivity to moisture adsorption and improves the MSL of the package; and less sensitivity to popcorning. Popcorning refers to package failure during solder reflow temperature excursion due to steam pressure created from the moisture absorbed where the failure is usually at the material interfaces which are the weak links.

Second Embodiment—Double Down-Set of Both the Inner/Center Die Pad 112 and the Outer Ring Die Pad 114; FIGS. 5 to 7

As shown in FIGS. 5 to 7, the second embodiment of the present invention is similar to the first embodiment (FIGS. 1 to 4) except that in this leadframe design, both the inner/center die pad 112 and the outer ring die pad 114 are down-set in relation to the inner portions 120 of lead fingers 116, and the backside 125 of the lower die/chip 126 is exposed. (The reference numerals for the second embodiment correspond to the reference numbers in the description in the first embodiment plus one-hundred, e.g. the inner/center die pad 12 of the first embodiment is the inner/center die pad 112 of the second embodiment, etc.)

Inner/center die pad 112 is spaced downwardly (down-set) from the inner portions 120 of lead fingers 116 as at 122 from preferably about 300 to 100 $\mu$m and more preferably from about 350 to 800 $\mu$m.

Outer ring die pad 114 is spaced downwardly (down-set) from the inner portions 120 of lead fingers 116 as at 121 from preferably about 150 to 500 $\mu$m and more preferably from about 150 to 300 $\mu$m.

Lower die/chip 126 is affixed to inner/center die pad 112 using die attachment (D/A) resin 128 and upper die/chip 130 is affixed to outer ring die pad 114 using D/A resin 132. Then, lower lead wires 134 are connected to the upper surface of the inner portion 120 of the lead fingers 116 and to the upper surface of lower die/chip 126 by wire bonding. Then, upper lead wires 136 are connected to the upper surface of the inner portion of 120 of lead fingers 116 and to the upper surface of upper die/chip 130 by wire bonding.

An encapsulant material 140 is then formed around the lower and upper die/chips 126, 130, lead wires 134, 136, inner/center die pad 112, outer ring die pad 114, etc. to complete package 110. However, it is noted that in the second embodiment, encapsulant material 140 does not surround the backside 125 of lower die/chip 126 to complete package 110 and thus exposes the backside 125 of the lower semiconductor chip 126. To improve the efficiency of heat dispation from package 110 to beneath printed circuit board (not shown), a heat conductive layer 142 may be interposed between the backside 125 of lower die/chip 126 when package 110 is attached to the motherboard (not shown).

As shown in FIG. 5, lower die/chip 126 is larger, i.e. wider and longer, than upper die/chip 130 to facilitate the wire bonding pattern. FIG. 6 illustrates, inter alia, a quad package 110 using the structure of FIG. 5 (without showing the dies/chips 126, 130) while FIG. 7. illustrates, inter alia, a dual in-line package 110 using the structure of FIG. 5 (without showing the dies/chips 126, 130).

It is noted that the die attachment interfaces for the inner/center die pad 112 to the lower die/chip 126 using resin 128 and for the outer ring die pad 114 to the upper die/chip 130 using resin 132 are greatly reduced compared to conventional attachment interfaces.

The second embodiment is an extension of the concepts of the first embodiment, and the further benefits and advantages of the second embodiment include having an exposed backside 125 of the lower die/chip 126 which provide an option to connect it to beneath printed circuit board (not shown) using a thermally conductive material for thermal enhancement.

Third Embodiment—Single Up-Set of the Outer Ring Die Pad 214 With Heat Sink 250

As shown in FIG. 8, the third embodiment of the present invention is again similar to the first embodiment (FIGS. 1 to 4) except that in this leadframe design, only the outer ring die pad 214 is up-set in relation to the inner portions 220 of the lead fingers 216, and a heatspreader 250 is affixed to the backside 225. (The reference numerals for the third embodiment correspond to the reference numbers in the description in the first embodiment plus two-hundred, e.g. the inner/center die pad 12 of the first embodiment is the inner/center die pad 212 of the third embodiment, etc.)

Inner/center die pad 212 is substantially in the same plane as the inner portions 220 of lead fingers 16 as shown in FIG. 8. Inner/center die pad 212 may be down-set if necessary. But to make the leadframe design simpler/manufacturable, and to enable simpler leadframe clamping during assembly process, it is preferable to have die pad 212 in the same plane as lead fingers 220. Note that for either case, the combined thickness of bottom die and heatspreader is critical to have the bottom side of heat sink exposed.

Outer ring die pad 214 is spaced upwardly (up-set) from the inner portions 220 of lead fingers 216 as at 221 from preferably about 100 to 800 µm and more preferably from about 200 to 500 µm.

A heatspreader 250 is affixed to the backside 225 of lower die/chip 226 and the encapsulant material 240 does not surround the backside 251 of heatspreader 250 to complete package 210. Leaving the backside 225 of heatspreader 250 exposed increases the efficiency of heat dissipation from package 210. Optionally, an additional heat conductive layer 242 may be interposed between the backside 225 of lower die/chip 226 when package 210 is attached to the motherboard (not shown).

The heatspreader 250 can be pre-attached to the leadframe (i.e., heatspreader 250 can be attached to leadframe using adhesive tape or laser-welded to leadframe before die attach process) before the backside 225 of the lower die/chip 226 is attached to the heatspreader 250. The lower die/chip 226 is then affixed to inner/center die pad 212 using die attachment (D/A) resin 228 and upper die/chip 230 is affixed to outer ring die pad 214 using D/A resin 232. Then, lower lead wires 234 are connected to the upper surface of finger leads 216 and to the upper surface of lower die/chip 226 by wire bonding. Then, upper lead wires 236 connected to the upper surface of finger leads 16 and to the upper surface of upper die/chip 30 by wire bonding.

Alternately, heatspreader 250 is affixed to the backside 225 of the lower die/chip 226 last instead of first. For instance, heatspreader 250 can be integrated into the package by dropping it into the cavity-up mold chase prior to molding process.

An encapsulant material 240 is then formed around the lower and upper die/chips 226, 230, lead wires 234, 236, inner/center die pad 212, outer ring die pad 214, etc. to complete package 210.

As shown in FIG. 8, lower die/chip 226 is larger, i.e. wider and longer, than upper die/chip 230 to facilitate the wire bonding pattern.

It is noted that the die attachment interfaces for the inner/center die pad 212 to the lower die/chip 226 using resin 228 and for the outer ring die pad 214 to the upper die/chip 230 using resin 232 are greatly reduced compared to conventional attachment interfaces.

The third embodiment is an extension of the concepts of the second embodiment, and the further benefits and advantages of the third embodiment include having an exposed heatspreader 250 to provide improved thermal performance as compared to the second embodiment.

Fourth Embodiment—Up-Set of the Outer Ring Die Pad 314 and Down-Set of the Inner/Center Die Pad 312 Using Same Sized Lower and Upper Dies/Chips 326, 330

Figure 9:
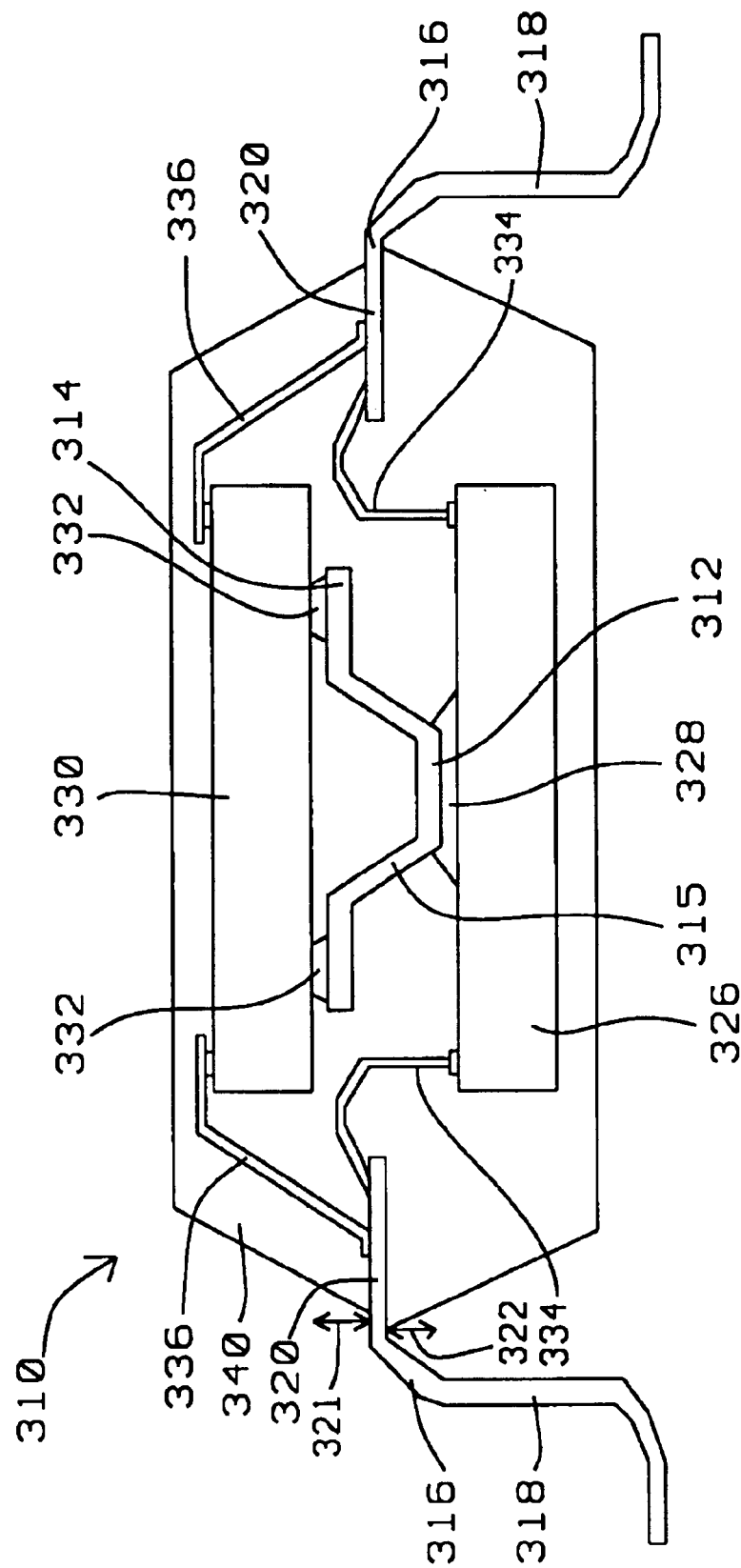
FIG. 9 schematically illustrates a cross-sectional view of the same size die/chip up & down-set fourth embodiment of the present invention.

As shown in FIG. 9, the fourth embodiment of the present invention is also similar to the first embodiment (FIGS. 1 to 4) except that in this leadframe design, the outer ring die pad 314 is up-set in relation to the inner portions 320 of the lead fingers 316 and the inner/center die pad 312 is down-set in relation to the inner portions 320 of the lead fingers 316 using same sized lower and upper dies/chips 326, 330. (The reference numerals for the fourth embodiment correspond to the reference numbers in the description in the first embodiment plus three-hundred, e.g. the inner/center die pad 12 of the first embodiment is the inner/center die pad 312 of the fourth embodiment, etc.)

Inner/center die pad 312 is spaced downwardly (down-set) from the inner portions 320 of lead fingers 316 as at 322 from preferably about 100 to 800 µm and more preferably from about 200 to 500 µm.

Outer ring die pad 314 is spaced upwardly (up-set) from the inner portions 320 of lead fingers 316 as at 321 from preferably about 100 to 800 µm and more preferably from about 200 to 500 µm.

In the fourth embodiment, a two pass process is used for the die 326, 330 attachments and wire bonding. First, lower die/chip 326 is affixed to inner/center die pad 312 using die attachment (D/A) resin 328 and lower lead wires 334 are then connected to the upper surface of lead fingers 316 and to the upper surface of lower die/chip 326 by wire bonding. Then, upper die/chip 330 is affixed to outer ring die pad 314 using D/A resin 332 and upper lead wires 336 are then connected to the upper surface of lead fingers 316 and to the upper surface of upper die/chip 330 by wire bonding.

An encapsulant material 340 is then formed around the lower and upper die/chips 326, 330, lead wires 334, 336, inner/center die pad 312, outer ring die pad 314, etc. to complete package 310.

As noted, the lower and upper dies/chips 326, 330 are the same size. Both die 326, 330 need not be the same size. But the upper die 330 can be of the same size or even slightly larger than the lower die 326, depending on the z height difference between down-set and up-set. So the separation of the die enables same size die stacking. Same size die 326, 330 stacking advantages: (a) allows combination of identical die into a single package and (b) allows more freedom in die combination as this configuration increases the maximum upper die size; helps designer to choose the upper die with an increased size range.

It is noted that the die attachment interfaces for the inner/center die pad 312 to the lower die/chip 326 using resin 328 and for the outer ring die pad 314 to the upper die/chip 330 using resin 332 are greatly reduced compared to conventional attachment interfaces.

The fourth embodiment is an extension of the concepts of the third embodiment, and the further benefits and advantages of the third embodiment include: not requiring a spacer between the lower and upper dies/chips 326, 330 (Prior art that allow combination of same size die stacking do have a spacer to create separation between them. This spacer is a 'third element' between the two die and increases cost and number of process steps.) and the combination of the down-set of the lower die/chip 326 and the up-set of the upper die/chip 330 achieve a separation between the dies/chips 326, 330 that is within high volume manufacturable limits.

Fifth Embodiment—Up-Set of the Outer Ring Die Pad 414 and Down-Set of the Inner/Center Die Pad 412 Using Same Sized Lower and Upper Dies/Chips 426, 430; Alternate Attachment of Lower Lead Wires 434

As shown in FIG. 10, the fifth embodiment of the present invention is also similar to the first embodiment (FIGS. 1 to 4) except that in this leadframe design, the outer ring die pad 414 is up-set in relation to the inner portions 420 of the lead fingers 416 and the inner/center die pad 412 is down-set in relation to the inner portions 420 of the lead fingers 416 using same sized lower and upper dies/chips 426, 430. (The reference numerals for the fifth embodiment correspond to the reference numbers in the description in the first embodiment plus four-hundred, e.g. the inner/center die pad 12 of the first embodiment is the inner/center die pad 412 of the fifth embodiment, etc.)

Inner/center die pad 412 is spaced downwardly (down-set) from the inner portions 420 of lead fingers 416 as at 422 from preferably about 100 to 800 $\mu$m and more preferably from about 150 to 500 $\mu$m.

Outer ring die pad 414 is spaced upwardly (up-set) from the inner portions 420 of lead fingers 416 as at 421 from preferably about 100 to 800 $\mu$m and more preferably from about 150 to 500 $\mu$m.

As opposed to the fourth embodiment (FIG. 9), the lower lead wires 434 are connected to the lower surface of lead fingers 416 and to the lower surface of lower die/chip 426 by wire bonding.

An encapsulant material 440 is then formed around the lower and upper die/chips 426, 430, lead wires 434, 436, inner/center die pad 412, outer ring die pad 414, etc. to complete package 410.

It is noted that the die attachment interfaces for the inner/center die pad 412 to the lower die/chip 426 using resin 428 and for the outer ring die pad 414 to the upper die/chip 430 using resin 432 are greatly reduced compared to conventional attachment interfaces.

The fifth embodiment has the same further benefits and advantages of the fourth embodiment with the further additional benefit and advantage of having lower mechanical stress level in the smaller die attach interface areas for both lower and upper die during; assembly process.

Sixth Embodiment—Reverse Form Down-Set of the Outer Ring Die Pad 514 and Up-Set of the Inner/Center Die Pad 512 Using Same Sized Lower and Upper Dies/Chips 526, 530; Alternate Attachment of Lower Lead Wires 534

As shown in FIG. 11, the sixth embodiment of the present invention is also similar to the first embodiment (FIGS. 1 to 4) except that in this leadframe design, the outer ring die pad 514 is down-set in relation to the inner portions 520 of the lead fingers 516 and the inner/center die pad 512 is up-set in relation to the inner portions 520 of the lead fingers 516 using same sized lower and upper dies/chips 526, 530. (The reference numerals for the sixth embodiment correspond to the reference numbers in the description in the first embodiment plus four-hundred, e.g. the inner/center die pad 12 of the first embodiment is the inner/center die pad 512 of the sixth embodiment, etc.)

The sixth embodiment is most similar to the fifth embodiment (FIG. 10) except for the reverse form of attaching: (1) the lower die/chip 526 to the down-set outer ring die pad 514 (instead of the inner/center die pad); and the upper die/chip 530 to the up-set inner/center die pad 512 (instead of to the outer ring die pad).

Inner/center die pad 512 is spaced upwardly (up-set) from the inner portions 520 of lead fingers 516 as at 521 from preferably about 100 to 800 $\mu$m and more preferably from about 150 to 500 $\mu$m.

Outer ring die pad 514 is spaced downwardly (down-set) from the inner portions 520 of lead fingers 516 as at 522 from preferably about 100 to 800 $\mu$m and more preferably from about 150 to 500 $\mu$m.

As in the fifth embodiment, the lower lead wires 534 are connected to the lower surface of inner lead portion 520 of lead fingers 516 and to the lower surface of lower die/chip 526 by wire bonding.

An encapsulant material 540 is then formed around the lower and upper die/chips 526, 530, lead wires 534, 536, inner/center die pad 512, outer ring die pad 514, etc. to complete package 510.

It is noted that the die attachment interfaces for the inner/center die pad 512 to the upper die/chip 530 using resin 528 and for the outer ring die pad 514 to the lower die/chip 526 using resin 532 are greatly reduced compared to conventional attachment interfaces.

The sixth embodiment has the same further benefits and advantages of the fourth and fifth embodiments.

Seventh Embodiment—Up-Set of the Outer Non-Ring Die Pad 614 and Down-Set of the Inner/Center Die Pad 612

As shown in FIGS. 12 and 13, the seventh embodiment of the present invention is also similar to the first embodiment (FIGS. 1 to 4) except that in this leadframe design, the outer die pads 614 are not in the shape of an outer ring and the outer die pads 614 are up-set in relation to the inner portions 620 of the lead fingers 616 and the inner/center die pad 612 is down-set in relation to the inner portions 320 of the lead fingers 316 using same sized lower and upper dies/chips 326, 330. (The reference numerals for the seventh embodiment correspond to the reference numbers in the description in the first embodiment plus six-hundred, e.g. the inner/center die pad 12 of the first embodiment is the inner/center die pad 612 of the seventh embodiment, etc.)

As noted, and as more clearly illustrated in FIG. 13, outer die pads 614 are separate die pads 614 interposed between respective outer tie bars 624 and inner tie bars 615.

Inner/center die pad 612 is spaced downwardly (down-set) from the inner portions 620 of lead fingers 616 as at 622 from preferably about 100 to 800 µm and more preferably from about 150 to 500 µm.

Outer die pads 614 are spaced upwardly (up-set) from the inner portions 620 of lead fingers 616 as at 621 from preferably about 100 to 800 µm and more preferably from about 150 to 800 µm.

As shown in FIGS. 12 and 13, lower die/chip 626 is larger, i.e. wider and longer, than upper die/chip 630 to facilitate the wire bonding pattern.

It is noted that the die attachment interfaces for the inner/center die pad 612 to the lower die/chip 626 using resin 628 and for the outer die pads 614 to the upper die/chip 630 using resin 632 are greatly reduced compared to conventional attachment interfaces.

In the seventh embodiment, a two pass process is used for the die 626, 3630 attachments and wire bonding. First, lower die/chip 626 is affixed to inner/center die pad 612 using die attachment (D/A) resin 628; lower lead wires 634 are then connected to the upper surface of inner portion 620 of lead fingers 616 and to the upper surface of lower die/chip 626 by wire bonding and grounding lead wires 662 are connected from the upper surface of lower die/chip 626 to the upper surface of inner/center die pad 612 by wire bonding. Then, upper die/chip 630 is affixed to the outer die pads 614 using D/A resin 632 and upper lead wires 636 are then connected to the upper surface of finger leads 616 and to the upper surface of upper die/chip 630 by wire bonding.

An encapsulant material 640 is then formed around the lower and upper die/chips 626, 630, lead wires 634, 636, grounding lead wires 662, inner/center die pad 612, outer ring die pad 614, etc. to complete package 610.

The further benefits and advantages of the seventh embodiment include: ground bonding can be made from the lower die/chip 626 to the inner/center die pad 612 and the ring-shaped outer ring die pad is replaced by discrete die pads 614 on the tie bars 615, 624 in that 'ground bonding' increases the electrical performance of the die in the package: higher operating speed with lesser interference between the leads.

While particular embodiments of the present invention have been illustrated and described, it is not intended to limit the invention, except as defined by the following claims.

We claim:

1. A leadframe design, comprising:
   an inner die pad structure lying in a first plane;
   an outer die pad structure lying in a second plane spaced apart from the inner die pad structure first plane and connected to the inner die pad by inner tie bars, the outer die pad structure is ring shaped and surrounds the inner die pad structure;
   an outer package surrounding at least the inner die pad structure and the inner tie bars; the outer die pad structure being supported by outer tie bars; the outer package having outer walls; and
   lead fingers extending through the outer package outer walls; the lead fingers including an inner portions extending into the outer package proximate the inner and outer die pad structures; the inner portions of the lead fingers lying in a third plane;
   wherein at least one of the inner die pad structure first plane and the outer die pad structure second plane lie outside of the lead finger inner portions third plane and wherein a first chip is affixed to the inner die pad structure and a second chip is affixed to the outer die pad structure.

2. The leadframe design of claim 1, wherein the first chip is affixed to the inner die pad structure by resin and the second chip is affixed to the outer die pad structure by resin.

3. The leadframe design of claim 1, wherein the inner die pad structure is rectangular in shape.

4. The leadframe design of claim 1, wherein the inner die pad structure is spaced a distance below the lead finger inner portions and the outer die pad structure is coplanar with the lead finger inner portions.

5. The leadframe design of claim 1, wherein the inner die pad structure is spaced from about 100 to 1000 µm below the lead finger inner portions.

6. The leadframe design of claim 1, wherein the inner die pad structure is spaced from about 200 to 500 µm below the lead finger inner portions.

7. The leadframe design of claim 1, wherein the inner die pad structure is spaced a distance below the lead finger inner portions; the outer die pad structure is coplanar with the lead finger inner portions; the first and second chips and the lead finger inner portions each have respective upper surfaces; the first chip connected to the lead finger inner portions by respective lower lead wires affixed to the upper surface of the first chip and the upper surfaces of the lead finger inner portions; and the second chip connected to the lead finger inner portions by respective upper lead wires affixed to the upper surface of the second chip and the upper structures of the lead finger inner portions.

8. The leadframe design of claim 1, wherein the outer die pad structure is spaced a first distance below the lead finger inner portions and the inner die pad structure is spaced a second distance below the lead finger inner portions; the second distance being greater than the first distance.

9. The leadframe design of claim 1, wherein the outer die pad structure is spaced from about 300 to 1000 µm below the lead finger inner portions and the inner die pad structure is spaced from about 350 to 800 µm below the lead finger inner portions.

10. The leadframe design of claim 1, wherein the outer die pad structure is spaced from about 150 to 500 µm below the lead finger inner portions and the inner die pad structure is spaced from about 150 to 300µ below the lead finger inner portions.

11. The leadframe design of claim 1, wherein the outer die pad structure is spaced a first distance below the lead finger inner portions and the inner die pad structure is spaced a second distance below the lead finger inner portions; the second distance being greater than the first distance; the first and second chips and the lead finger inner portions each have respective upper surfaces; the first chip connected to the lead finger inner portions by respective lower lead wires affixed to the upper surface of the first chip and the upper surfaces of the lead finger inner portions; and the second chip connected to the lead finger inner portions by respective upper lead wires affixed to the upper surface of the second chip and the upper surfaces of the lead finger inner portions.

12. The leadframe design of claim 1, wherein the outer die pad structure is spaced a distance above the lead finger inner portions and the inner die pad structure is coplanar with the lead finger inner portions.

13. The leadframe design of claim 1, wherein the outer die pad structure is spaced from about 100 to 800 µm above the lead finger inner portions.

14. The leadframe design of claim 1, wherein the outer die pad structure is spaced from about 200 to 500 µm above the lead finger inner portions.

15. The leadframe design of claim 1, wherein the outer die pad structure is spaced a distance above the lead finger inner portions and the inner die pad structure is coplanar with the lead finger inner portions; the first and second chips and the lead finger inner portions each have respective upper surfaces; the first chip connected to the lead finger inner portions by respective lower lead wires affixed to the upper surface of the first chip and the upper surfaces of the lead finger inner portions; and the second chip connected to the lead finger inner portions by respective upper lead wires affixed to the upper surface of the second chip and the upper surfaces of the lead finger inner portions.

16. The leadframe design of claim 1, wherein the outer die pad structure is spaced above the lead finger inner portions and the inner die pad structure is spaced below the lead finger inner portions.

17. The leadframe design of claim 1, wherein the outer die pad structure is spaced from about 100 to 800 µm above the lead finger inner portions and the inner die pad structure is spaced from about 100 to 800 µm below the lead finger inner portions.

18. The leadframe design of claim 1, wherein the outer die pad structure is spaced from about 200 to 500 µm above the lead finger inner portions and the inner die pad structure is spaced from about 200 to 500 µm below the lead finger inner portions.

19. The leadframe design of claim 1, wherein the outer die pad structure is spaced above the lead finger inner portions and the inner die pad structure is spaced below the lead finger inner portions; the first and second chips and the lead finger inner portions each have respective upper surfaces; the first chip connected to the lead finger inner portions by respective lower lead wires affixed to the upper surface of the first chip and the upper surfaces of the lead finger inner portions; and the second chip connected to the lead finger inner portions by respective upper lead wires affixed to the upper surface of the second chip and the upper surfaces of the lead finger inner portions.

20. The leadframe design of claim 1, wherein the outer die pad structure is spaced above the lead finger inner portions and the inner die pad structure is spaced below the lead finger inner portions; the first and second chips and the lead finger inner portions each have respective upper and lower surfaces; the first chip connected to the lead finger inner portions by respective lower lead wires affixed to the lower surface of the first chip and the lower surfaces of the lead finger inner portions; and the second chip connected to the lead finger inner portions by respective upper lead wires affixed to the upper surface of the second chip and the upper surfaces of the lead finger inner portions.

21. The leadframe design of claim 1, wherein the outer die pad structure is spaced above the lead finger inner portions and the inner die pad structure is spaced below the lead finger inner portions; the inner die pad structure, the first and second chips and the lead finger inner portions each have respective upper and lower surfaces; the first chip connected to the lead finger inner portions by respective lower lead wires affixed to the upper surface of the first chip and the upper surfaces of the lead finger inner portions; the second chip connected to the lead finger inner portions by respective upper lead wires affixed to the upper surface of the second chip and the upper surfaces of the lead finger inner portions; and the inner die pad structure connected to the lead finger inner portions by respective grounding lead wires affixed to the upper surface of the inner die pad structure and the upper surfaces of the lead finger inner portions.

22. The leadframe design of claim 1, wherein the inner die pad structure is spaced a distance above the lead finger inner portions and the outer die pad structure is spaced a distance below the lead finger inner portions.

23. The leadframe design of claim 1, wherein the inner die pad structure is spaced from about 100 to 800 µm above the lead finger inner portions, and the outer die pad structure is spaced from about 100 to 800 µm below the lead finger inner portions.

24. The leadframe design of claim 1, wherein the inner die pad structure is spaced from about 100 to 500 µm above the lead linger inner portions, and the outer die pad structure is spaced from about 100 to 500 µm below the lead finger inner portions.

25. The leadframe design of claim 1, wherein the inner die pad structure is spaced a distance above the lead finger inner portions; the outer die pad structure is spaced a distance below the lead finger inner portions; the first and second chips and the lead finger inner portions each have respective upper surfaces; the first chip connected to the lead finger inner portions by respective upper lead wires affixed to the upper surface of the first chip and the upper surfaces of the lead finger inner portions; and the second chip connected to the lead finger inner portions by respective lower lead wires affixed to the lower surface of the second chip and the lower structures of the lead finger inner portions.

26. The leadframe design of claim 1, wherein the first and second chips are the same size.

27. The leadframe design of claim 1, wherein the second chip is smaller than the first chip.

28. The leadframe design of claim 1, wherein a heat sink structure is affixed to the first chip.

29. The leadframe design of claim 1, wherein a heat sink structure is affixed to the first chip, and a heat conductive layer is affixed to the heat sink structure.

30. The leadframe design of claim 1, wherein the inner die pad structure is positioned within an area encircled by bond pads.

31. A leadframe design, comprising:
  an inner die pad structure lying in a first plane;
  an outer die pad structure lying in a second plane spaced apart from the inner die pad structure first plane and connected to the inner die pad by inner tie bars, the outer die pad structure is ring shaped and surrounds the inner die pad structure;
  an outer package surrounding at least the inner die pad structure and the inner tie bars; the outer die pad structure being supported by outer tie bars; the outer package having outer walls; and
  lead fingers extending through the outer package outer walls; the lead fingers including an inner portions extending into the outer package proximate die inner and outer die pad structures; the inner portions of the lead fingers lying in a third plane; wherein at least one of the inner die pad structure first plane and the outer die pad structure second plane lie outside of the lead finger inner portions third plane and wherein a first chip is affixed to the inner die pad structure and a second chip is affixed to the outer die pad structure, and wherein the inner die pad structure is spaced a distance below the lead finger inner portions and the outer die pad structure is coplanar with the lead finger inner portions.

32. The leadframe design of claim 31, wherein the first chip is affixed to the inner die pad structure by resin and the second chip is affixed to the outer die pad structure by resin.

33. The leadframe design of claim 31, wherein the inner die pad structure is rectangular in shape.

34. The leadframe design of claim 31, wherein the inner die pad structure is spaced from about 100 to 1000 $\mu$m below the lead finger inner portions.

35. The leadframe design of claim 31, wherein the inner die pad structure is spaced from about 200 to 500 $\mu$m below the lead finger inner portions.

36. The leadframe design of claim 31, wherein the inner die pad structure is spaced a distance below the lead finger inner portions; the outer die pad structure is coplanar with the lead finger inner portions; the first and second chips and the lead finger inner portions each have respective upper surfaces; the first chip connected to the lead finger inner portions by respective lower lead wires affixed to the upper surface of the first chip and the upper surfaces of the lead finger inner portions; and the second chip connected to the lead finger inner portions by respective upper lead wires affixed to the upper surface of the second chip and the upper structures of the lead finger inner portions.

37. The leadframe design of claim 31, wherein the inner die pad structure is positioned within an area encircled by bond pads.

38. A leadframe design, comprising:
an inner die pad structure lying in a first plane;
an outer die pad structure lying in a second plane spaced apart from the inner die pad structure first plane and connected to the inner die pad by inner tie bars, the outer die pad structure is ring shaped and surrounds the inner die pad structure;
an outer package surrounding at least the inner die pad structure and the inner tie bars; the outer die pad structure being supported by outer tie bars; the outer package having outer walls; and
lead fingers extending through the outer package outer walls; the lead fingers including an inner portions extending into the outer package proximate the inner and outer die pad structures; the inner portions of the lead fingers lying in a third plane; wherein at least one of the inner die pad structure first plane and the outer die pad structure second plane lie outside of the lead finger inner portions third plane and wherein a first chip is affixed to the inner die pad structure and a second chip is affixed to the outer die pad structure, and wherein the outer die pad structure is spaced a first distance below the lead finger inner portions and the inner die pad structure is spaced a second distance below the lead finger inner portions; the second distance being greater than the first distance.

39. The leadframe design of claim 38, wherein the first chip is affixed to the inner die pad structure by resin and the second chip is affixed to the outer die pad structure by resin.

40. The leadframe design of claim 38, wherein the inner die pad structure is rectangular in shape.

41. The leadframe design of claim 38, wherein the outer die pad structure is spaced from about 300 to 1.000 $\mu$m below the lead finger inner portions and the inner die pad structure is spaced from about 350 to 800 $\mu$m below the lead finger inner portions.

42. The leadframe design of claim 38, wherein the outer die pad structure is spaced from about 150 to 500 $\mu$m below the lead finger inner portions and the inner die pad structure is spaced from about 150 to 300 $\mu$m below the lead finger inner portions.

43. The leadframe design of claim 38, wherein the outer die pad structure is spaced a first distance below the lead finger inner portions and the inner die pad structure is spaced a second distance below the lead finger inner portions; the second distance being greater than the first distance; the first and second chips and the lead finger inner portions each have respective upper surfaces; the first chip connected to the lead finger inner portions by respective lower lead wires affixed to the upper surface of the first chip and the upper surfaces of the lead finger inner portions; and the second chip connected to the lead finger inner portions by respective upper lead wires affixed to the upper surface of the second chip and the upper surfaces of the lead finger inner portions.

44. The leadframe design of claim 38, wherein the inner die pad structure is positioned within an area encircled by bond pads.

45. A leadframe design, comprising:
an inner die pad structure lying in a first plane;
an outer die pad structure lying in a second plane spaced apart from the inner die pad structure first plane and connected to the inner die pad by inner tie bars, the outer die pad structure is ring shaped and surrounds the inner die pad structure;
an outer package surrounding at least the inner die pad structure and the inner tie bars; the outer die pad structure being supported by outer tie bars; the outer package having outer walls; and
lead fingers extending through the outer package outer walls; the lead fingers including an inner portions extending into the outer package proximate the inner and outer die pad structures; the inner portions of the lead fingers lying in a third plane;
wherein at least one of the inner die pad structure first plane and the outer die pad structure second plane lie outside of the lead finger inner portions third plane and wherein a first chip is affixed to the inner die pad structure and a second chip is affixed to the outer die pad structure, and wherein the outer die pad structure is spaced a distance above the lead finger inner portions and the inner die pad structure is coplanar with the lead finger inner portions.

46. The leadframe design of claim 45, wherein the first chip is affixed to the inner die pad structure by resin and the second chip is affixed to the outer die pad structure by resin.

47. The leadframe design of claim 45, wherein the inner die pad structure is rectangular in shape.

48. The leadframe design of claim 45, wherein the outer die pad structure is spaced from about 100 to 800 $\mu$m above the lead finger inner portions.

49. The leadframe design of claim 45, wherein the outer die pad structure is spaced from about 200 to 500 $\mu$m above the lead finger inner portions.

50. The leadframe design of claim 45, wherein the outer die pad structure is spaced a distance above the lead finger inner portions and the inner die pad structure is coplanar with the lead finger inner portions; the first and second chips and the lead finger inner portions each have respective upper surfaces; the first chip connected to the lead finger inner portions by respective lower lead wires affixed to the upper surface of the first chip and the upper surfaces of the lead finger inner portions; and the second chip connected to the lead finger inner portions by respective upper lead wires affixed to the upper surface of the second chip and the upper surfaces of the lead finger inner portions.

51. The leadframe design of claim 45, wherein the inner die pad structure is positioned within an area encircled by bond pads.

52. A leadframe design, comprising:
an inner die pad structure lying in a first plane;
an outer die pad structure lying in a second plane spaced apart from the inner die pad structure first plane and connected to the inner die pad by inner tie bars, the outer die pad structure is ring shaped and surrounds the inner die pad structure;
an outer package surrounding at least the inner die pad structure and the inner tie bars; the outer die pad structure being supported by outer tie bars; the outer package having outer walls; and
lead fingers extending through the outer package outer walls; the lead fingers including an inner portions extending into the outer package proximate the inner and outer die pad structures; the inner portions of the lead fingers lying in a third plane;
wherein at least one of the inner die pad structure first plane and the outer die pad structure second plane lie outside of the lead finger inner portions third plane and wherein a first chip is affixed to the inner die pad structure and a second chip is affixed to the outer die pad structure, and wherein the first and second chips are the same size.

53. The leadframe design of claim 52, wherein the first chip is affixed to the inner die pad structure by resin and the second chip is affixed to the outer die pad structure by resin.

54. The leadframe design of claim 52, wherein the inner die pad structure is rectangular in shape.

55. The leadframe design of claim 52, wherein the outer die pad structure is spaced above the lead finger inner portions and the inner die pad structure is spaced below the lead finger inner portions.

56. The leadframe design of claim 52, wherein the outer die pad structure is spaced from about 100 to 800 μm above the lead finger inner portions and the inner die pad structure is spaced from about 100 to 800 μm below the lead finger inner portions.

57. The leadframe design of claim 52, wherein the outer die pad structure is spaced from about 200 to 500 μm above the lead finger inner portions and the inner die pad structure is spaced from about 200 to 500 μm below the lead finger inner portions.

58. The leadframe design of claim 52, wherein the outer die pad structure is spaced above the lead finger inner portions and the inner die pad structure is spaced below the lead finger inner portions; the first and second chips and the lead finger inner portions each have respective upper surfaces; the first chip connected to the lead finger inner portions by respective lower lead wires affixed to the upper surface of the first chip and the upper surfaces of the lead finger inner portions; and the second chip connected to the lead finger inner portions by respective upper load wires affixed to the upper surface of the second chip and the upper surfaces of the lead finger inner portions.

59. The leadframe design of claim 52, wherein the inner die pad structure is positioned within an area encircled by bond pads.

60. A leadframe design, comprising:
an inner die pad structure lying in a first plane;
an outer die pad structure lying in a second plane spaced apart from the inner die pad structure first plane and connected to the inner die pad by inner tie bars, the outer die pad structure is ring shaped and surrounds the inner die pad structure;
an outer package surrounding at least the inner die pad structure and the inner tie bars; the outer die pad structure being supported by outer tie bars; the outer package having outer walls; and
lead fingers extending through the outer package outer walls; the lead fingers including an inner portions extending into the outer package proximate the inner and outer die pad structures; the inner portions of the lead fingers lying in a third plane;
wherein at least one of the inner die pad structure first plane and the outer die pad structure second plane lie outside of the lead finger inner portions third plane and wherein a first chip is affixed to the inner die pad structure and a second chip is affixed to the outer die pad structure, and wherein the outer die pad structure is spaced above the lead finger inner portions and the inner die pad structure is spaced below the lead finger inner portions; the first and second chips and the lead finger inner portions each have respective upper and lower surfaces the first chip connected to the lead finger inner portions by respective lower lead wires affixed to the lower surface of the first chip and the lower surfaces of the lead finger inner portions; and the second chip connected to the lead finger inner portions by respective upper lead wires affixed to the upper surface of the second chip and the upper surfaces or the lead finger inner portions.

61. The leadframe design of claim 60, wherein the first chip is affixed to the inner die pad structure by resin and the second chip is affixed to the outer die pad structure by resin.

62. The leadframe design of claim 60, wherein the inner die pad structure is rectangular in shape.

63. The leadframe design of claim 60, wherein the inner die pad structure is positioned within an area encircled by bond pads.

64. A leadframe design, comprising:
an inner die pad structure lying in a first plane;
an outer die pad structure lying in a second plane spaced apart from the inner die pad structure first plane and connected to the inner die pad by inner tie bars, the outer die pad structure is ring shaped and surrounds the inner die pad structure;
an outer package surrounding at least the inner die pad structure and the inner tie bars; the outer die pad structure being supported by outer tie bars; the outer package having outer walls; and
lead fingers extending through the outer package outer walls; the lead 10 fingers including an inner portions extending into the outer package proximate the inner and outer die pad structures; the inner portions of the lead fingers lying in a third plane;
wherein at least one of the inner die pad structure first plane and the outer die pad structure second plane lie outside of the lead finger inner portions third plane and wherein a first chip is affixed to the inner die pad structure and a second chip is affixed to the outer die pad structure, and wherein the inner die pad structure is spaced a distance above the lead finger inner portions and the outer die pad structure is spaced a distance below the lead finger inner portions.

65. The leadframe design of claim 64, wherein the first chip is affixed to the inner die pad structure by resin and the second chip is affixed to the outer die pad structure by resin.

66. The leadframe design of claim 64, wherein the inner die pad structure is rectangular in shape.

67. The leadframe design of claim 64, wherein the inner die pad structure is spaced from about 100 to 800 μm above the lead finger inner portions, and the outer die pad structure is spaced from about 100 to 800 μm below the lead finger inner portions.

68. The leadframe design of claim 64, wherein the inner die pad structure is spaced from about 100 to 500 μm above the lead finger inner portions, and the outer die pad structure is spaced from about 100 to 500 μm below the lead finger inner portions.

69. The leadframe design of claim 64, wherein the first and second chips and the lead finger inner portions each have respective upper surfaces; the first chip connected to the lead finger inner portions by respective upper lead wires affixed to the upper surface of the first chip and the upper surfaces of the lead finger inner portions; and the second chip connected to the lead finger inner portions by respective lower lead wires affixed to the lower surface of the second chip and the lower structures of the lead finger inner portions.

70. The leadframe design of claim 64, wherein the first and second chips are the same size.

71. The leadframe design of claim 64, wherein the inner die pad structure is positioned within an area encircled by bond pads.

72. A leadframe design, comprising:
an inner die pad structure lying in a first plane;
an outer die pad structure lying in a second plane spaced apart from the inner die pad structure first plane and connected to the inner die pad by inner tie bars, the outer die pad structure is ring shaped and surrounds the inner die pad structure;
an outer package surrounding at least the inner die pad structure and the inner tie bars; the outer die pad structure being supported by outer tie bars; the outer package having outer wails; and
lead fingers extending through the outer package outer walls; the lead fingers including an inner portions extending into the outer package proximate the inner and outer die pad structures; the inner portions of the lead fingers lying in a third plane;
wherein at least one of the inner die pad structure first plane and the outer die pad structure second plane lie outside of the lead finger inner portions third plane and wherein a first chip is affixed to the inner die pad structure and a second chip is affixed to the outer die pad structure, and wherein the outer die pad structure is spaced above the lead finger inner portions and the inner die pad structure is spaced below the lead finger inner portions; the inner die pad structure, the first and second chips and the lead finger inner portions each have respective upper and lower surfaces; the first chip connected to the lead finger inner portions by respective lower lead wires affixed to the upper surface of the first chip and the upper surfaces of the lead finger inner portions; the second chip connected to the lead finger inner portions by respective upper lead wires affixed to the upper surface of the second chip and the upper surfaces of the lead finger inner portions; and the inner die pad structure connected to the lead finger inner portions by respective grounding lead wires affixed to the upper surface of the inner die pad structure and the upper surfaces of the lead finger inner portions.

73. The leadframe design of claim 72, wherein the first chip is affixed to the inner die pad structure by resin and the second chip is affixed to the outer die pad structure by resin.

74. The leadframe design of claim 72, wherein the inner die pad structure is rectangular in shape.

75. The leadframe design of claim 72, wherein the second chip is smaller than the first chip.

76. The leadframe design of claim 72, wherein the inner die pad structure is positioned within an area encircled by bond pads.

77. A method of forming a leadframe design, comprising;
providing an inner die pad structure lying in a first plane;
providing an outer die pad structure lying in a second plane spaced apart from the inner die pad structure first plane and connected to the inner die pad by inner tie bars, the outer die pad structure is ring shaped and surrounds the inner die pad structure;
providing an outer package surrounding at least the inner die pad structure and the inner tie bars; the outer die pad structure being supported by outer tie bars; the outer package having outer walls; and
providing lead fingers extending through the outer package outer walls; the lead fingers including an inner portions extending into the outer package proximate the inner and outer die pad structures; the inner portions of the lead fingers lying in a third plane;
wherein at least one of the inner die pad structure first plane and the outer die pad structure second plane lie outside of the lead finger inner portions third piano and wherein a first chip is affixed to the inner die pad structure and a second chip is affixed to the outer die pad structure.

78. A method of forming a leadframe design, comprising:
providing an inner die pad structure lying in a first plane;
providing an outer die pad structure lying in a second plane spaced apart from the inner die pad structure first plane and connected to the inner die pad by inner tie bars, the outer die pad structure is ring shaped and surrounds the inner die pad structure;
providing an outer package surrounding at least the inner die pad structure and the inner tie bars; the outer die pad structure being supported by outer tie bars; the outer package having outer walls; and
providing lead fingers extending through the outer package outer walls; the lead fingers including an inner portions extending into the outer package proximate the inner and outer die pad structures; the inner portions of the lead fingers lying in a third plane;
wherein at least one of the inner die pad structure first plane and the outer die pad structure second plane lie outside of the lead finger inner portions third plane and wherein a first chip is affixed to the inner die pad structure and a second chip is affixed to the outer die pad structure, and wherein the inner die pad structure is spaced a distance below the lead finger inner portions and the outer die pad structure is coplanar with the lead finger inner portions.

79. A method of forming a leadframe design, comprising:
providing an inner die pad structure lying in a first plane;
providing an outer die pad structure lying in a second plane spaced apart from the inner die pad structure first plane and connected to the inner die pad by inner tie bars, the outer die pad structure is ring shaped and surrounds the inner die pad structure;
providing an outer package surrounding at least the inner die pad structure and the inner tie bars; the outer die pad structure being supported by outer tie bars; the outer package having outer walls; and
providing lead fingers extending through the outer package outer wails; the lead fingers including an inner portions extending into the outer package proximate the inner and outer die pad structures; the inner portions of the lead fingers lying in a third plans;
wherein at least one of the inner die pad structure first plane and the outer die pad structure second plane lie outside of the lead finger inner portions third plane and wherein a first chip is affixed to the inner die pad structure and a second chip is affixed to the outer die pad structure, and wherein the outer die pad structure is spaced a first distance below the lead finger inner portions and the inner die pad structure is spaced a second distance below the lead finger inner portions; the second distance being greater than the first distance.

80. A method of forming a leadframe design, comprising:
providing an inner die pad structure lying in a first plane;
providing an outer die pad structure lying in a second plane spaced apart from the inner die pad structure first plane and connected to the inner die pad by inner tie bars, the outer die pad structure is ring shaped and surrounds the inner die pad structure;
providing an outer package surrounding at least the inner die pad structure and the inner tie bars; the outer die pad structure being supported by outer tie bars; the outer package having outer walls; and
providing lead fingers extending through the outer package outer walls; the lead fingers including an inner portions extending into the outer package proximate the inner and outer die pad structures; the inner portions of the lead fingers lying in a third plane;
wherein at least one of the inner die pad structure first plane and the outer die pad structure second plane lie outside of the lead finger inner portions third plane and wherein a first chip is affixed to the inner die pad structure and a second chip is affixed to the outer die pad structure, and wherein the outer die pad structure is spaced a distance above the lead finger inner portions and the inner die pad structure is coplanar with the lead finger inner portions.

81. A method of forming a leadframe design, comprising:
providing an inner die pad structure lying in a first plane;
providing an outer die pad structure lying in a second plane spaced apart from the inner die pad structure first plane and connected to the inner die pad by inner tie bars, the outer die pad structure is ring shaped and surrounds the inner die pad structure;
providing an outer package surrounding at least the inner die pad structure and the inner tie bars; the outer die pad structure being supported by outer tie bars; the outer package having outer walls; and
providing lead fingers extending through the outer package outer walls; the lead fingers including an inner portions extending into the outer package proximate the inner and outer die pad structures; the inner portions of the lead fingers lying in a third plane;
wherein at least one of the inner die pad structure first plane and the outer die pad structure second plane lie outside of the lead finger inner portions third plane and wherein a first chip is affixed to the inner die pad structure and a second chip is affixed to the outer die pad structure, and wherein the first and second chips are the same size.

82. A method of forming a leadframe design, comprising:
providing an inner die pad structure lying in a first plane;
providing an outer die pad structure lying in a second plane spaced apart from the inner die pad structure first plane and connected to the inner die pad by inner tie bars, the outer die pad structure is ring shaped and surrounds the inner die pad structure;
providing an outer package surrounding at least the inner die pad structure and the inner tie bars; the outer die pad structure being supported by outer tie bars; the outer package having outer walls; and
providing lead fingers extending through the outer package outer walls; the lead fingers including an inner portions extending into the outer package proximate the inner and outer die pad structures; the inner portions of the lead fingers lying in a third plane;
wherein at least one of the inner die pad structure first plane and the outer die pad structure second plane lie outside of the lead finger inner portions third plane and wherein a first chip is affixed to the inner die pad structure and a second chip is affixed to the outer die pad structure, and wherein the outer die pad structure is spaced above the lead finger inner portions and the inner die pad structure is spaced below the lead finger inner portions; the first and second chips and the lead finger inner portions each have respective upper and lower surfaces; the first chip connected to the lead finger inner portions by respective lower lead wires affixed to the lower surface of the first chip and the lower surfaces of the lead finger inner portions; and the second chip connected to the lead finger inner portions by respective upper lead wires affixed to the upper surface of the second chip and the upper surfaces of the lead finger inner portions.

83. A method of forming a leadframe design, comprising:
providing an inner die pad structure lying in a first plane;
providing an outer die pad structure lying in a second plane spaced apart from the inner die pad structure first plane and connected to the inner die pad by inner tie bars, the outer die pad structure is ring shaped and surrounds the inner die pad structure;
providing an outer package surrounding at least the inner die pad structure and the inner tie bars; the outer die pad structure being supported by outer tie bars; the outer package having outer walls; and
providing lead fingers extending through the outer package outer walls; the lead fingers including an inner portions extending into the outer package proximate the inner and outer die pad structures; the inner portions of the lead fingers lying in a third plane;
wherein at least one of the inner die pad structure first plane and the outer die pad structure second plane lie outside of the lead finger inner portions third plane and wherein a first chip is affixed to the inner die pad structure and a second chip is affixed to the outer die pad structure, and wherein the inner die pad structure is spaced a distance above the lead finger inner portions and the outer die pad structure is spaced a distance below the lead finger inner portions.

84. A method of forming a leadframe design, comprising:
providing an inner die pad structure lying in a first plane;
providing an outer die pad structure lying in a second plane spaced apart from the inner die pad structure first plane and connected to the inner die pad by inner tie bars, the outer die pad structure is ring shaped and surrounds the inner die pad structure;
providing an outer package surrounding at least the inner die pad structure and the inner tie bars, the outer die pad structure being supported by outer tie bars; the outer package having outer walls; and
providing lead fingers extending through the outer package outer walls; the lead fingers including an inner portions extending into the outer package proximate the inner and outer die pad structures; the inner portions of the lead fingers lying in a third plane;

wherein at least one of the inner die pad structure first plane and the outer die pad structure second plane lie outside of the lead finger inner portions third plane and wherein a first chip is affixed to the inner die pad structure and a second chip is affixed to the outer die pad structure, and wherein the outer die pad structure is spaced above the lead finger inner portions and the inner die pad structure is spaced below the lead finger inner portions; the inner die pad structure, the first and second chips and the lead finger inner portions each have respective upper and lower surfaces; the first chip connected to the lead finger inner portions by respective lower lead wires affixed to the upper surface of the first chip and the upper surfaces of the lead finger inner portions; the second chip connected to the lead finger inner portions by respective upper lead wires affixed to the upper surface of the second chip and the upper surfaces of the lead finger inner portions; and the inner die pad structure connected to the lead finger inner portions by respective grounding lead wires affixed to the upper surface of the inner die pad structure and the upper surfaces of the lead finger inner portions.

* * * * *

UNITED STATES PATENT AND TRADEMARK OFFICE
CERTIFICATE OF CORRECTION

PATENT NO. : 6,841,858 B2
DATED : January 11, 2005
INVENTOR(S) : Shim et al.

It is certified that error appears in the above-identified patent and that said Letters Patent is hereby corrected as shown below:

<u>Column 16,</u>
Line 24, delete "or" and insert therefor -- of --

<u>Column 18,</u>
Line 20, delete "piano" and insert therefor -- plane --
Line 62, delete "wails" and insert therefor -- walls --
Line 65, delete "plans" and insert therefor -- plane --

Signed and Sealed this

Nineteenth Day of April, 2005

JON W. DUDAS
*Director of the United States Patent and Trademark Office*